United States Patent [19]

Kwan et al.

[11] Patent Number: 5,654,680

[45] Date of Patent: Aug. 5, 1997

[54] SAW-BASED LADDER FILTER INCLUDING MULTIPLE COUPLING COEFFICIENTS ($K^2$), METHOD THEREFOR AND RADIO INCORPORATING SAME

[75] Inventors: Philip Pak-Lin Kwan, Sunnyvale, Calif.; Ali-Reza Baghai-Wadji, Mesa; David Penunuri, Fountain Hills, both of Ariz.

[73] Assignee: Motorola, Inc., Schaumburg, Ill.

[21] Appl. No.: 593,946

[22] Filed: Jan. 30, 1996

[51] Int. Cl.⁶ .................................................. H03H 9/64
[52] U.S. Cl. ..................... 333/195; 333/196; 310/313 D; 310/313 C
[58] Field of Search .................................. 333/193–196; 310/313 R, 313 B, 313 C, 313 D

[56] References Cited

U.S. PATENT DOCUMENTS

| | | | |
|---|---|---|---|
| 5,313,177 | 5/1994 | Hickernell et al. | 333/193 |
| 5,327,626 | 7/1994 | Cho et al. | 29/25.35 |
| 5,434,464 | 7/1995 | Hickernell et al. | 310/313 D |
| 5,471,178 | 11/1995 | Hickernell | 333/193 |
| 5,486,800 | 1/1996 | Davenport | 333/193 |
| 5,499,003 | 3/1996 | Davenport | 333/193 |
| 5,506,552 | 4/1996 | Seki et al. | 333/195 |

FOREIGN PATENT DOCUMENTS

| | | |
|---|---|---|
| 0652637 | 4/1994 | European Pat. Off. |
| 2-250413 | 10/1990 | Japan. |
| 6291600 | 10/1994 | Japan. |

*Primary Examiner*—Benny Lee
*Assistant Examiner*—Darius Gambino
*Attorney, Agent, or Firm*—Frederick M. Fliegel

[57] ABSTRACT

A full duplex radio (10) having improved properties obtained by using surface acoustic wave (SAW) filters (92, 100, 100') having asymmetric frequency responses (76', 76", 140). The filters (92, 100, 100') are composed of series ($50_1$, $50_1'$) and parallel ($50_2$, $50_2'$) coupled SAW resonators. Asymmetry is obtained by altering the metallization thickness of either of the series ($50_1$, $50_1'$) or parallel ($50_2$, $50_2'$) resonators of each filter (92, 100, 100') to increase or decrease the SAW coupling coefficient of some of the resonators ($50_1$, $50_1'$, $50_2$, $50_2'$) relative to the remainder of the resonators ($50_1$, $50_1'$, $50_2$, $50_2'$). The filters (92, 100, 100') are desirably in pairs arranged with mirror image frequency asymmetry such that the steeper skirts (93, 95) of the frequency responses (76', 76", 140) are adjacent. Greater passband bandwidths (91', 91") can be obtained without adverse affect on transmitter and receiver isolation.

19 Claims, 6 Drawing Sheets

SAW-BASED LADDER FILTER INCLUDING MULTIPLE COUPLING COEFFICIENTS ($K^2$), METHOD THEREFOR AND RADIO INCORPORATING SAME

This application is related to U.S. patent application Ser. No. 08/554,559 which is assigned to the same assignee as the instant application.

FIELD OF THE INVENTION

The present invention relates to apparatus and methods for improved radios and filters, and more particularly, improved radios and filters employing Surface Acoustic Wave (SAW) devices.

BACKGROUND OF THE INVENTION

Surface acoustic wave (SAW) devices are much used today in electronic communication, especially SAW devices arranged to provide filtering functions. Filters formed from SAW devices are particularly useful in connection with paging apparatus, communications links, portable radio and telephones. Such radio telephones operate typically in the 500–1500 MHz range and higher.

Filter characteristics that are of particular interest to the radio designer are: (a) passband bandwidth, i.e., a range of frequencies wherein the filter passes a signal with acceptable loss, (b) passband attenuation, i.e., how little passband loss is incurred, (c) transition bandwidth, i.e., a range of frequencies separating pass- and stop-bands and (d) stopband attenuation, i.e., attenuation outside pass- and transition-bands where no signal is desired to be transmitted through the filter. Stopbands are frequency regions wherein the filter provides very high attenuation. The transition band is the frequency region in which the attenuation rapidly increases from a low value (little attenuation) at the passband corner frequency to a high value (large attenuation) in the stopband. The transition band is also referred to in the art as the "skirt" of the filter transfer characteristic, e.g., the fall-off region on either side of the passband on a plot of filter attenuation versus frequency.

It is a feature of prior art SAW filters that the pass- and transition-bandwidths are related. The choice and cut of piezoelectric substrate material from which the SAW filter is constructed, the number of electrodes and electrode shape, spacing and location influence SAW filter characteristics. Design modifications causing increased passband bandwidth together with optimal insertion loss generally also increase transition bandwidth. Conversely, those choices providing small transition bandwidths also yield narrow passband bandwidths. This effectively precludes SAW filter designs from simultaneously providing relatively wide passband bandwidth together with very narrow transition bandwidths, i.e., steep skirts on the filter transfer characteristic.

An advantage of the present invention is that it overcomes these limitations of the prior art so that greater passband bandwidth is obtained while preserving a narrow transition-bandwidth (steep skirt) on at least one side of the passband. Such SAW filters are advantageously used to improve the properties of radios.

DETAILED DESCRIPTION OF THE PREFERRED EMBODIMENT

As used herein, the term "SAW" is defined to mean surface acoustic waves, surface skimming bulk acoustic waves and other acoustic waves useful in the operation of microwave acoustic filters.

Figure 1:
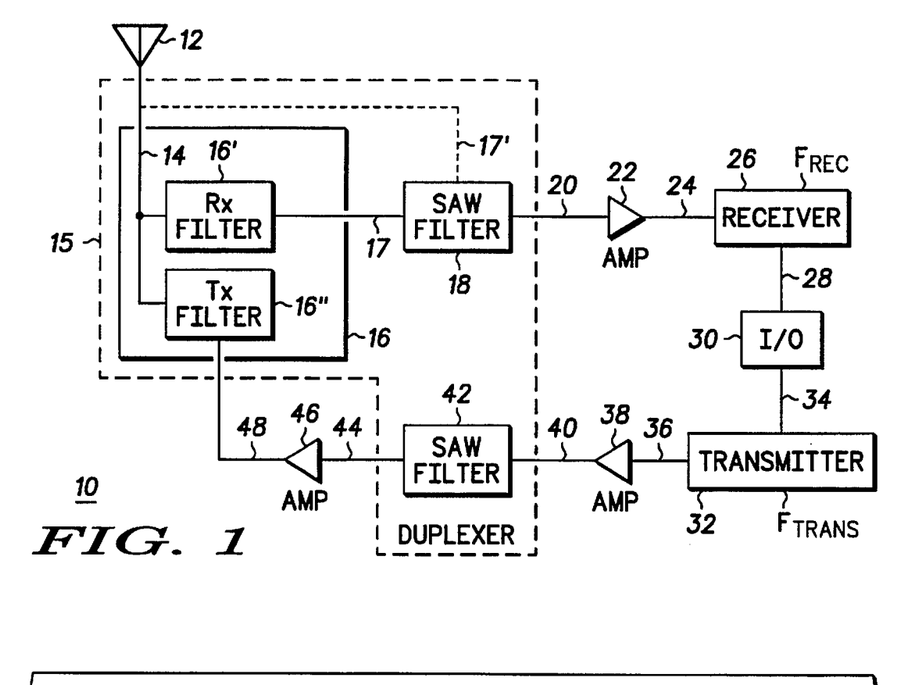
FIG. 1 is a schematic block diagram of a radio utilizing one or more improved SAW filters of the present invention.

FIG. 1 is a schematic block diagram of radio 10 embodying one or more improved SAW filters according to the present invention. Radio 10 comprises antenna 12 which is coupled by line 14 to Transmit/Receiver (T/R) filter 16. The purpose of T/R filter 16 is to help provide isolation between receive frequencies ($F_{rec}$) and transmit frequencies ($F_{trans}$) so that duplex communication can occur, i.e., simultaneous reception and transmission.

T/R filter 16 conveniently has two sub-portions, $R_x$ receive filter 16' and $T_x$ transmit filter 16". Filter 16' is tuned to pass the receive frequencies $F_{rec}$ to line 17 and receive channel SAW filter 18 while attenuating transmit frequencies $F_{trans}$ coming from line 48 and transmit power amplifier 46. Filter 16" is tuned to pass the transmit frequencies ($F_{trans}$) on line 48 from transmit power amplifier 46 and attenuate any sidebands generated within amplifier 46 that might overlap $F_{rec}$. T/R filter 16 can comprise one or both of sub-filters 16', 16". For example, when $R_x$ filter 16' is omitted, receive SAW filter 18 is coupled directly to antenna lead 14 as shown by alternative lead 17'. In this circumstance, T/R filter 16 contains only $T_x$ filter 16" tuned to $F_{trans}$.

Incoming signals are passed via lines 17 or 17' to receive SAW filter 18 which is coupled by line 20 to pre-amplifier 22 which is in turn coupled by line 24 to receiver 26. Receiver 26 demodulates amplified incoming signals and delivers them via line 28 to input/output (I/O) device 30 which includes, e.g., an annunciator and/or other digital or analog output device(s). In a communications transceiver intended for voice communications, I/O device 30 generally includes a microphone, speaker or headphone, display and other conventional circuitry for volume control and signal processing. When digitized voice transmission is employed, I/O device 30 also generally includes a CODEC. Persons of skill in the art will understand that many different functions can be included in I/O device 30 depending upon the nature of the information desired to be received/transmitted. Non-limiting examples of different types of information are voice, video, fax and data.

I/O device 30 is coupled to transmitter section 32 by line 34 so that signals originating within I/O device 30 can be broadcast by radio 10. The output of transmitter section 32, usually comprising a modulated radio frequency (RF) signal, is coupled via line 36 to pre-amplifier 38 and via line 40 to transmit SAW filter 42, and thence by line 44 to final power amplifier 46, by line 48 to $T_x$ filter 16", and then by lead 14 to antenna 12 from which the signal provided by I/O device 30 is transmitted in radio frequency (RF) modulated form to another radio. Any form of modulation or coding well known in the art may be employed by radio 10. Radio 10 is distinguished from the prior art by, among other things, the properties of filters 16, 18 and/or 42 which are described in more detail below. Filters 16, 18, 42 can be formed as separate SAW filters or can be on a common substrate as indicated by dashed line 15 or a combination thereof.

Figure 2:
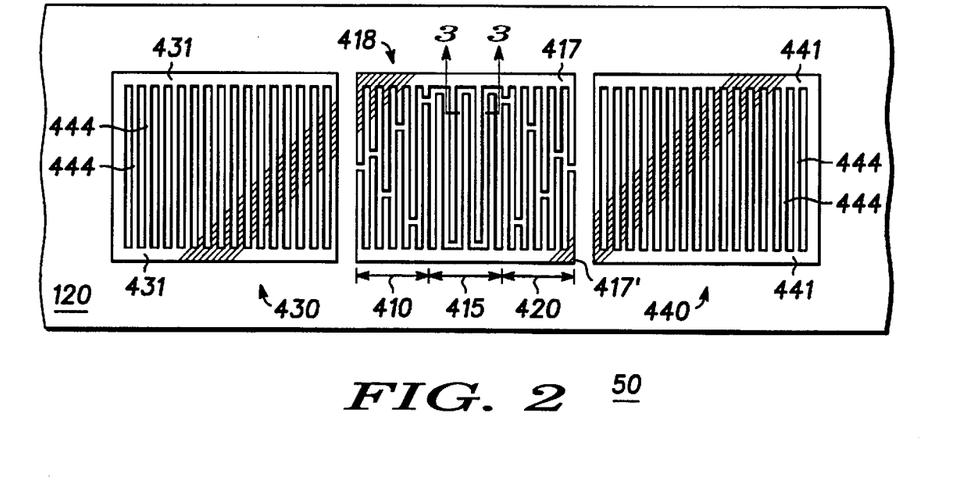
FIG. 2 is a simplified schematic top view of an elemental portion of a SAW filter, illustrating a SAW electrode structure in simplified form.

FIG. 2 is a simplified schematic top view of elemental SAW resonator or device 50 which is used to form a SAW filter. Elemental SAW resonator 50 comprises piezoelectric substrate 120 on which are formed interleaved electrodes. Substrate 120 may be made of any piezoelectric material, but quartz, lithium niobate and lithium tantalate are particularly useful, with 41° LiNbO$_3$, 64° LiNbO$_3$, and 36° LiTaO$_3$ being preferred. Filter 50 is typically fabricated by depositing and patterning a thin metal film, often comprising aluminum in a thickness ranging from tens to hundreds of nanometers thick, by photolithographic techniques similar to those employed in semiconductor integrated circuit manufacturing.

The present invention is especially useful when low insertion loss is required together with a wide passband width, for which higher electromechanical coupling coefficient substrates are particularly well suited. Crystals of these materials cut at different angles are employed, according to techniques well known in the art.

FIG. 2 illustrates SAW device 50 including transducer 418 having optional apodized end regions 410, 420 surrounding central, unapodized region 415 and having bus bars 417, 417', all disposed on substrate 120. The individual fingers or electrodes within regions 410, 420 are optionally weighted using apodization. Typically, either optional apodized end regions 410, 420 are employed or optional reflectors 430, 440 but not both together in a single resonator structure. The purpose of the apodization is to remove passband ripple that otherwise results and additionally the transducer employing apodization may incorporate a smaller footprint, i.e., require less substrate area than a transducer or resonator employing optional reflectors 430, 440. Typically, only about 10% of the total number of fingers in transducer 418 are apodized with about 5% of them being at one (or the other) end of transducer 418, however, this might vary between 3% to 10%, depending on the desired characteristics.

Figure 3:
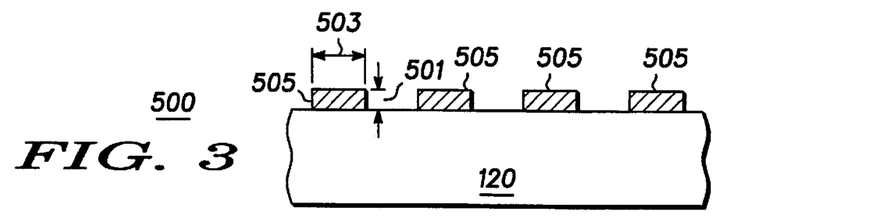
FIG. 3 is a sketch showing a side view, in section, taken along section lines 3—3 of FIG. 2, of a portion of an acoustic wave filter in accordance with the present invention.

FIG. 3 is a sketch showing a side view, in section, taken along section lines 3—3 of FIG. 2, of portion 500 of an acoustic wave filter in accordance with the present invention. Applicants have discovered a range of metallization thicknesses 501 for electrodes 505 on piezoelectric substrate 120 that increases effective coupling coefficient ($K^2$) and hence bandwidth of the resulting frequency response curve. Applicants have observed bandwidth variations ranging from about 22 MHz (r~0.27) to about 33 MHz (r~0.35) for devices fabricated using the same photomask pattern and substrate material for filter patterns having center frequencies in the range of 800 or 900 MHz for different metallization aspect ratios r. As the metallization thickness of electrodes 505 on substrate 120 increases, altered filter characteristics are achieved. However, after a certain desirable thickness of metallization is achieved (e.g., corresponding to an approximate aspect ratio of 0.35 or so in this particular case), additional metallization thickness 501 has the effect of decreasing coupling coefficient and degrading filter properties. Aspect ratio r is defined as height 501 divided by width 503.

Figure 4:
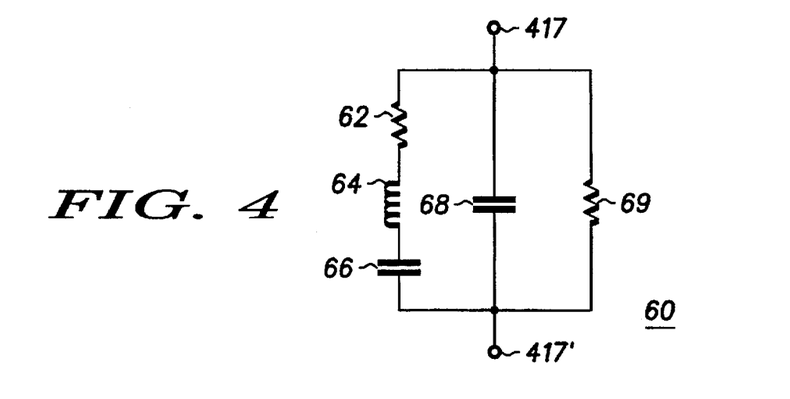
FIG. 4 is a simplified electrical equivalent circuit of the physical structure of FIG. 2.

FIG. 4 shows simplified electrical equivalent circuit 60 of elemental SAW resonator or device 50 of FIG. 2. Circuit 60 has connections 417, 417' corresponding to bus bars 417, 417' of device 50 of FIG. 2. Circuit 60 comprises series resistance 62, inductance 64 and capacitance 66, parallel capacitance 68 and parallel resistance 69. Resistances 62, 69 account for the signal loss encountered in the SAW device passband. Persons of skill in the art will understand that elemental SAW device 50 represented by equivalent circuit 60 has a series resonant frequency ($f_r$) at which the impedance between terminals 417, 417' becomes very small and a parallel resonant frequency ($f_a$), also referred to as the "anti-resonant" frequency, where the impedance between terminals 417, 417' is very large. In general, $f_a > f_r$.

Figure 5:
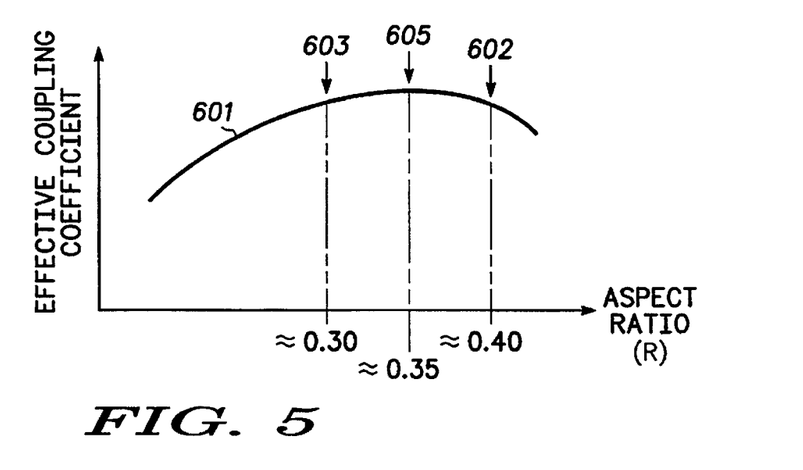
FIG. 5 is a graph showing a measured relationship between the effective coupling coefficient and electrode aspect ratio of an acoustic wave filter in accordance with the present invention.

FIG. 5 is a graph representing the relationship between aspect ratio r and effective SAW electromechanical coupling coefficient for aluminum metallization on thirty-six degree rotated lithium tantalate. Trace 601 shows that the effective coupling coefficient reaches a maximum at approximately r=0.35 (corresponding to point 605), with aspect ratios in the range of from about 0.32 to about 0.35 being preferred, in a range of from 0.30 to 0.40 being useful and aspect ratios of greater than 0.5 or less than 0.25 not being preferred. There may also be reasons to deviate from the preferred aspect ratio point when designing a filter in practice, such as the need to adjust the transducer velocity slightly in order to change the location of spurious lobes in the amplitude response. Thus, the present invention employs an aspect ratio of approximately 0.32 for use in the design of ladder SAW filters constructed on lithium tantalate and employing surface skimming bulk waves. When electrode width 503 (FIG. 3) is λ/4, aspect ratios of r~0.32 correspond to electrode heights 501 of about 7–9% λ. Applicants have further discovered that the effective coupling coefficients for series (e.g., $50_1$, FIG. 6) and shunt (e.g., $50_2$, FIG. 6) transducers are not necessarily equal and in some applications are desirably different as is discussed in detail in connection with FIGS. 8–14 and associated text, infra. Applicants have additionally discovered that this may be effectuated by employing different metal thicknesses in one or more of series (e.g., $50_1$, FIG. 6) or shunt (e.g., $50_2$, FIG. 6) transducers.

FIG. 5 also shows points r~0.3 (603) and r~0.4 (602) which indicate that the coupling coefficient can be made to decrease from the maximum value at r~0.35 (605). Our data show that at r~0.4 (602) the coupling coefficient is reduced by about 10% and that at r~0.3 (603) the coupling coefficient is reduced by about 15% from the maximum. For example, depending on the specific transducer, the coupling coefficient at the maximum point can be as much as 8%. Therefore, at r~0.3 (603), the coupling coefficient is reduced to 6.8% (86% of 8%). This is typical of the difference in coupling coefficient which can be achieved between SAW transducers such as between the series and shunt transducers in a ladder filter. In this particular example, we then require that these transducers have geometries with the relationship $0.86=(W_2/W_1)(H_1/H_2)$, where W corresponds to dimension 503 (FIG. 3), H corresponds to dimension 501 and the subscripts 1 and 2 refer to the series and shunt transducers, respectively.

In practice there are at least two different ways to achieve transducers with different electrode aspect ratios: (i) to hold the electrode width constant but vary the metal thickness and (ii) to hold the metal thickness constant but vary the electrode width. With reference to the example given above, in the first case, $0.86=H_1/H_2$; in the second case, $0.86=W_2/W_1$. For purpose of illustration, a typical design fabricated on 36°-cut lithium tantalate and having a center frequency of about 900 MHz with $H_1 \sim 150$ nm, the acoustic wavelength $\lambda$ is about 4.7 micrometers and $W_1$ is ~1.18 μm (or $\lambda/4$). Using method (i) we would need $H_2 \sim 128.5$ nm and using method (ii) would require $W_2 \sim 1.01$ μm.

Figure 6:
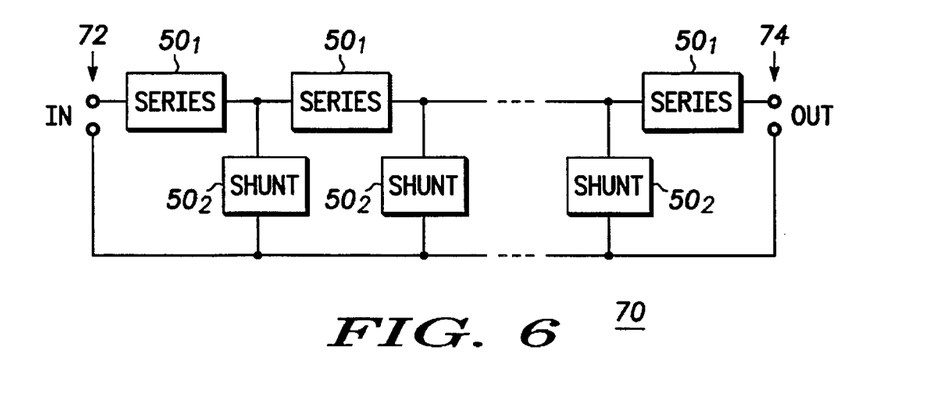
FIG. 6 illustrates, in simplified form, how multiple elemental structures of FIGS. 2–4 are combined in a series-parallel arrangement to produce a SAW filter.
Figure 7:
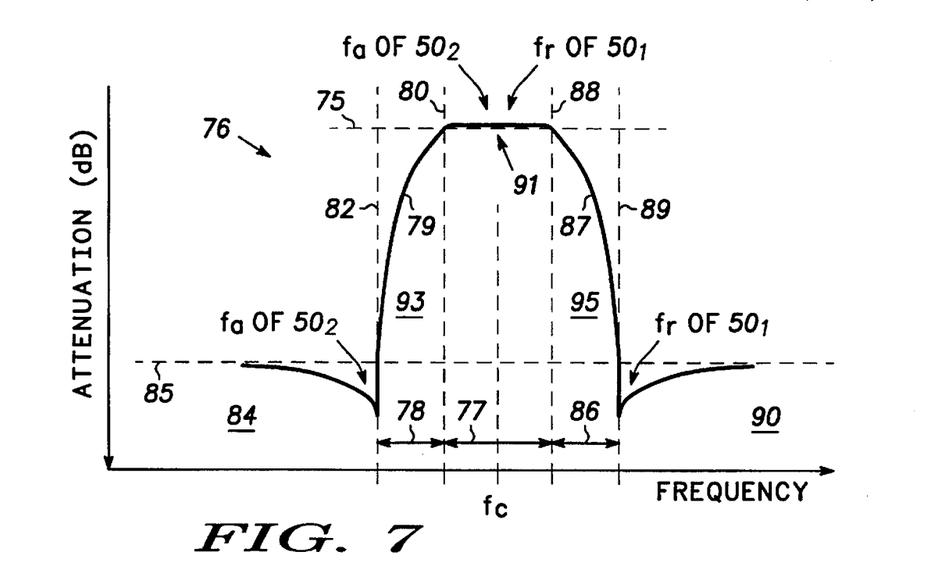
FIG. 7 shows an illustrative SAW filter transfer characteristic for the structure of FIG. 6 wherein the SAW electromechanical coupling coefficients of the series and parallel resonators are substantially the same.

FIG. 6 illustrates, in simplified form, SAW filter 70 with input 72 and output 74, formed from multiple repetitions of similar SAW resonators or devices 50, usefully formed on a common piezoelectric substrate (e.g., 120, FIG. 2), arranged in series-parallel connection. Series connected resonators are denoted by the reference numbers $50_1$ and parallel (i.e., shunt) connected resonators are denoted by the reference numbers $50_2$. FIG. 7 shows attenuation versus frequency transfer characteristic 76 of SAW filter 70. Each of series elements $50_1$ and parallel elements $50_2$ are formed from resonator 50 of FIG. 2. Individual series resonators $50_1$ and parallel resonators $50_2$ can be tuned to slightly different frequencies to vary the shape of transfer characteristic 76. Persons of skill in the art will understand based on techniques well known in the art how to choose the number of series-parallel stages and their individual values of $f_a$ and $f_r$ needed to achieve a desired passband and stopband bandwidth. It is often desirable to set $f_a$ of shunt resonators $50_2$ about equal to $f_r$ of series resonators $50_1$, as indicated at the top of FIG. 7. These resonances substantially determine the filter passband frequency.

Transfer characteristic 76 has passband 91 of bandwidth 77 wherein attenuation is less than a predetermined amount indicated by horizontal dashed line 75. Transfer characteristic 76 has lower transition band 93 of bandwidth 78 corresponding to lower transition or skirt 79 between lower passband corner frequency 80 and lower stopband edge frequency 82 where the attenuation exceeds predetermined level 85. Frequency 82 corresponds approximately to $f_r$ of parallel resonators $50_2$. Stopband 84 lies below frequency 82.

Transfer characteristic 76 has upper transition band 95 of bandwidth 86 corresponding to upper transition or skirt 87 between upper passband corner frequency 88 and upper stopband edge frequency 89 where the attenuation exceeds predetermined level 85. Frequency 89 corresponds approximately to $f_a$ of series resonators $50_1$. Stopband 90 lies above frequency 89.

In the case of SAW filters composed of multiple SAW resonators 50 of the type shown in FIG. 2, passband bandwidth 77 and transition bandwidths 78, 86 are related and dependent on the SAW coupling coefficient $K^2$, where $K^2$ is a property of the substrate material and electrode geometries (see FIGS. 2–5 and associated text). Choosing a value of $K^2$ that increases passband bandwidth 77 also increases transition bandwidths 78, 86. Choosing a lower value of $K^2$ (e.g., by changing the material, cut or electrode dimensions) and accordingly using more electrodes makes transition bandwidths 78, 86 smaller, but also narrows passband bandwidth 77. Choosing larger values of $K^2$ and thus fewer electrodes has the opposite effect, i.e., widens both pass- 77 and transition- 78, 86 bandwidths. Thus, the designer of conventional SAW filters is often frustrated by conflicting requirements for wide passband bandwidths and narrow transition bandwidths. This is especially important in connection with radios where SAW filters are desired to be used to prevent spurious signals from the transmitter section from interfering with the receiver section of a full-duplex radio, such as is illustrated in FIG. 1.

Figure 8:
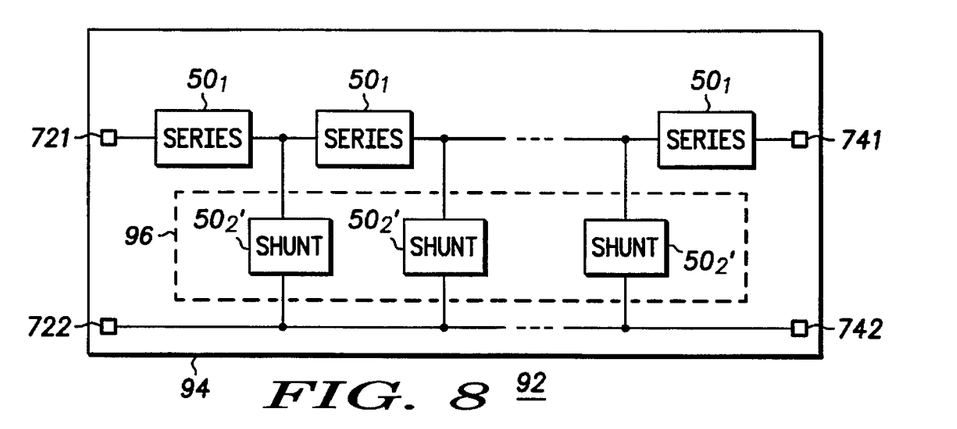
FIG. 8 is a simplified plan view of a SAW filter according to the present invention wherein elemental devices of FIGS. 2–4 are arranged in series-parallel combination and the parallel resonators are modified to increase their SAW electromechanical coupling coefficient.

The above-noted difficulties are overcome by making the effective coupling coefficients $K^2$ different for different portions of the filter of FIG. 8. How this is done is illustrated in FIGS. 10–14. FIG. 8 is a simplified plan view of SAW filter 92 according to a first embodiment of the present invention wherein elemental devices or resonators of FIGS. 2–4 are arranged in series-parallel combination (similar to the arrangement described in connection with FIG. 6) but with the parallel resonators $50_2$ modified to increase their effective SAW coupling coefficient $K^2$. Resonators $50_1$ or $50_2$ which have been modified to increase their coupling coefficients are identified by addition of a prime symbol, as in $50_1{}'$ or $50_2{}'$.

Filter 92, with input electrodes 721, 722 and output electrodes 741, 742, is formed on piezoelectric substrate 94 such as has already been described. Filter 92 comprises multiple series coupled resonators $50_1$ and multiple parallel coupled resonators $50_2{}'$, each analogous to elemental device 50, except that parallel resonators $50_2{}'$ have been modified to have larger values of $K^2$ than the associated series resonators $50_1$. This is conveniently accomplished by increasing the thickness (501, FIG. 3) of the parallel resonator electrodes, i.e., to correspond to point 605 of trace 601 (FIG. 5).

Increasing thickness 501 of the metallization of parallel resonators $50_2$ (or reducing electrode width 503) has the effect of increasing the effective value of $K^2$ for those resonators while leaving the series resonators unaffected. The resonant frequencies of the transducers having increased thickness 501 (or reduced electrode width 503) will, in general, be shifted slightly from their original values. However, persons of skill in the art can readily determine the magnitude of the expected shift depending upon the amount and physical properties of the metal and substrate being used so that values of $f_a$ and $f_r$ for the resonators prior to increasing thickness 501 or reducing width 503 can be offset. In this way $f'_a$ and $f'_r$ obtained after modifying the metallization thickness or electrode width for selected resonators or transducers will have the desired values.

Figure 9:
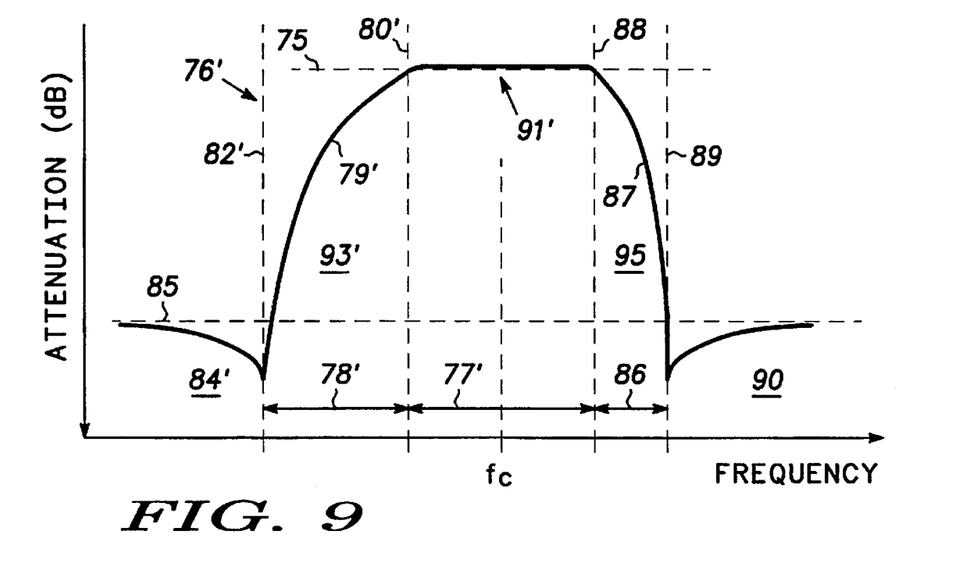
FIG. 9 shows an illustrative SAW filter transfer characteristic for the structure of FIG. 8.

FIG. 9 shows an illustrative SAW filter transfer characteristic 76' for the structure of FIG. 8. Upper stopband 90, upper attenuation frequency 89, upper transition width 86 and upper passband corner frequency 88 are relatively undisturbed. In particular, transition bandwidth 86 is substantially the same as for filter 70. However, the optimized thickness 501 and electrode configuration of parallel resonators $50_2$' provides passband 91' of larger passband bandwidth 77' and transition-band 93' of larger transition bandwidth 78'. Lower passband corner frequency 80', and lower stopband corner frequency 82' and stopband 84' are moved to lower frequencies. Filter 92 provides a significant improvement over prior art filters where it is being used to filter out a powerful signal source which is higher in frequency than the filter passband, without sacrifice of passband bandwidth 77'. Thus, filter 92 is useful in radio 10 as filter 16' and/or 18 where $f_{trans}$ is above $f_{rec}$ or as filter 16" and/or 42 where the $f_{rec}$ is above $f_{trans}$ (see FIG. 14).

Figure 10:
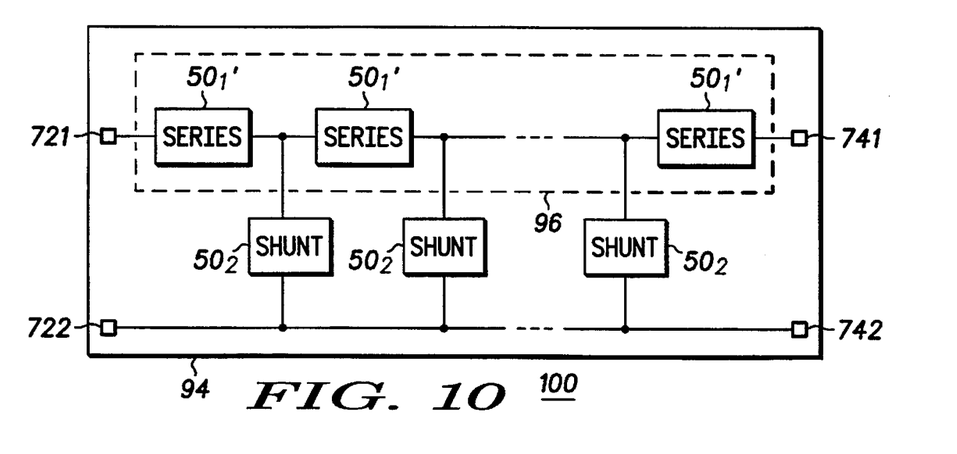
FIG. 10 is a simplified plan view of a SAW filter similar to that of FIG. 8 but wherein the series resonators are modified to increase their SAW electromechanical coupling coefficient.

FIG. 10 is a simplified plan view of SAW filter 100 similar to SAW filter 92 of FIG. 8 but wherein series resonators $50_1$ are modified to increase their SAW coupling coefficients, i.e., as $50_1$'. SAW filter 100 with input connection 721, 722 and output connections 741, 742 has parallel elements $50_2$ and series elements $50_1$' wherein series elements $50_1$' are similar to elements $50_1$ in FIG. 8 but modified by altering the thickness of the metallization (or reducing electrode widths) of the transducer in substantially the same way as in connection with elements $50_2$' of FIG. 8. The effect of optimizing height 501 and the electrode width 503 is to increase (or decrease) the coupling coefficients $K^2$ and to allow choice of electrode number and configuration to increase passband 77 and transition 78, 86 bandwidth without compromise of insertion loss characteristics. This has an effect shown in FIG. 11 which illustrates transfer characteristic 76" corresponding to filter 100.

Figure 11:
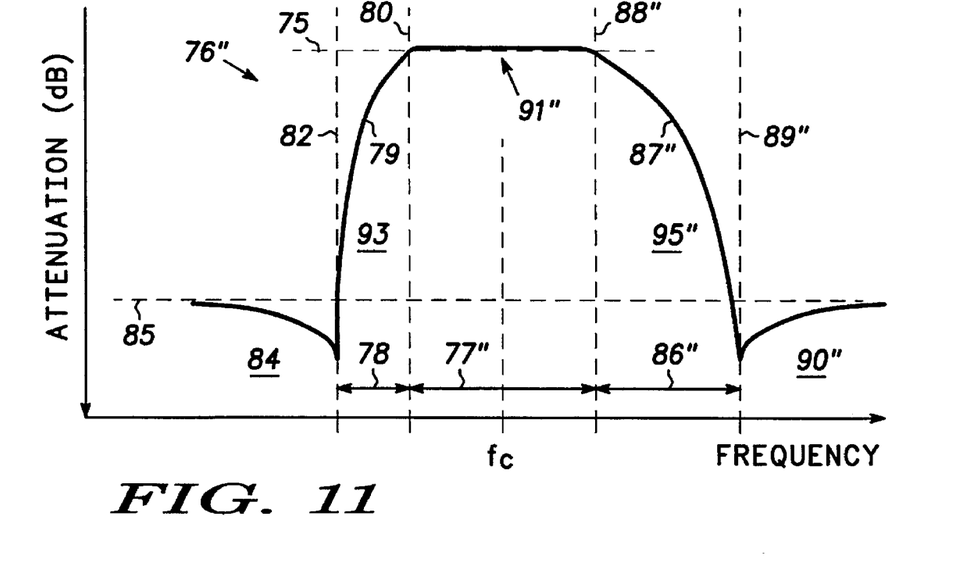
FIG. 11 shows an illustrative SAW filter transfer characteristic for the structure of FIG. 10.

Transfer characteristic 76" has lower stopband 84, lower stopband corner frequency 82, lower transition skirt 79 and lower transition band 93 of bandwidth 78, analogous to that in FIG. 7, with transition bandwidth 78 substantially the same. Increasing the effective coupling coefficient $K^2$ of series elements $50_1$' has the effect of raising upper passband corner frequency 88", upper stopband corner frequency 89" and stopband 90". Thus, passband 91" has increased bandwidth 77" and transition band 95" has greater bandwidth 86". Filter 100 provides a significant improvement over prior art filters where it is used to filter out a powerful signal source which is lower in frequency than the filter passband, without sacrifice of passband bandwidth. Thus, filter 100 is useful in radio 10 as filter 16' and/or 18 where $f_{trans}$ is below $f_{rec}$ or as filter 16" and/or 42 where the $f_{rec}$ is below $f_{trans}$ (see FIG. 14).

Figure 12:
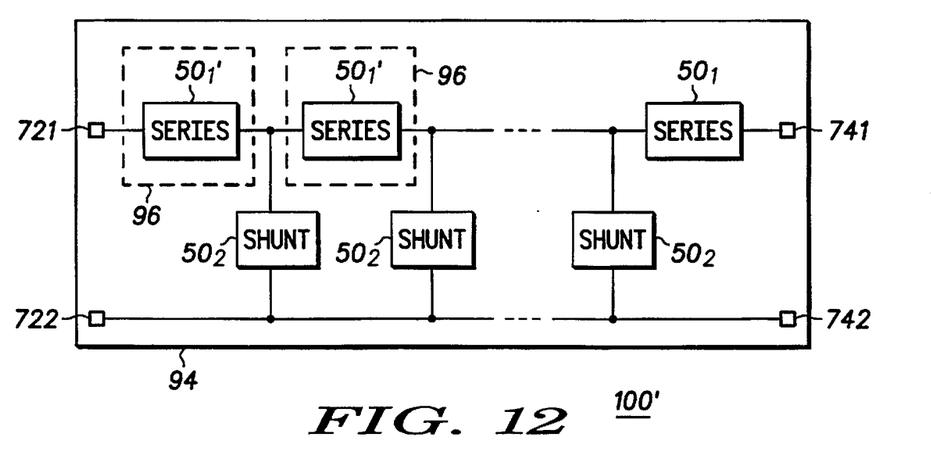
FIG. 12 shows a structure similar to that illustrated in FIG. 10 but where only a portion of the series resonators have been modified.

FIG. 12 is analogous to FIG. 10 except that filter 100' has only some of series elements $50_1$' having modified electrode height 501 so as to provide filter properties intermediate between those of filter 70 and filter 100. The number of series resonators $50_1$ to be provided with the increase in $K^2$ will depend upon the particular characteristic desired by the user.

While the modifications to filters 92, 100 relative to filter 70 have been described in terms of raising $K^2$ of certain series or parallel resonators, those of skill in the art will understand based on the description herein that while the described arrangement is particularly convenient, what is important is providing a difference of $K^2$ values between the series resonators and the parallel resonators of the same filter. This can be accomplished by either raising or lowering $K^2$ values of series resonators relative to parallel resonators or vice-versa so that a difference exists.

Figure 13:
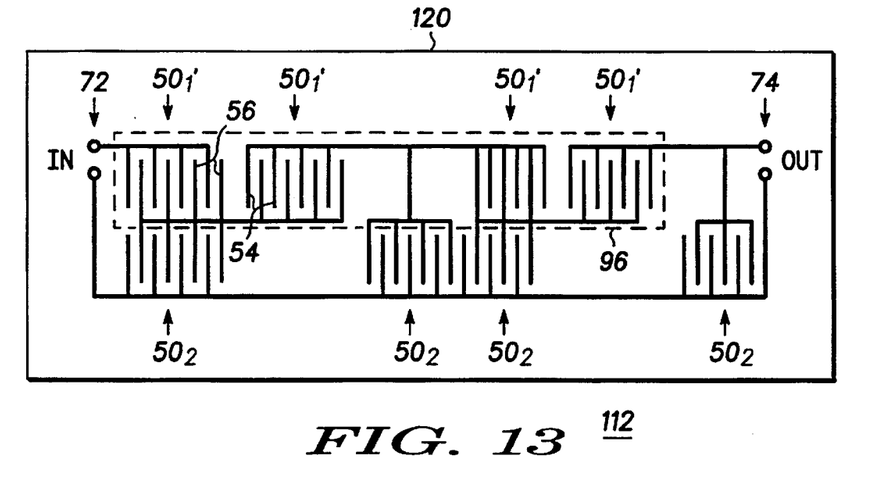
FIG. 13 shows a simplified plan view of the electrode fingers of multiple elemental resonators as in FIG. 2, coupled to form a device similar to that shown in FIGS. 6, 8, 10, 12, but with a coupling coefficient modification analogous to that shown in FIG. 10.

FIG. 13 shows filter 112 illustrating in greater detail how electrodes 54, 56 of elemental structures $50_1$, $50_2$ are conveniently arranged on substrate 120 and coupled to form a ladder structure analogous to that shown in FIGS. 6, 8, 10, 12, but with the coupling coefficient modification analogous to that of FIG. 10, i.e., series resonating elements $50_1$' having optimized electrode height 501. It will be apparent from FIG. 13 that a very compact structure can be obtained by appropriate arrangement of electrodes 54, 56 into series devices $50_1$' and parallel devices $50_2$ so that common lines are shared. This arrangement can also be used to construct the other filters described herein with different ones of the series ($50_1$) or parallel ($50_2$) resonators modified to have different values of $K^2$.

Figure 14:
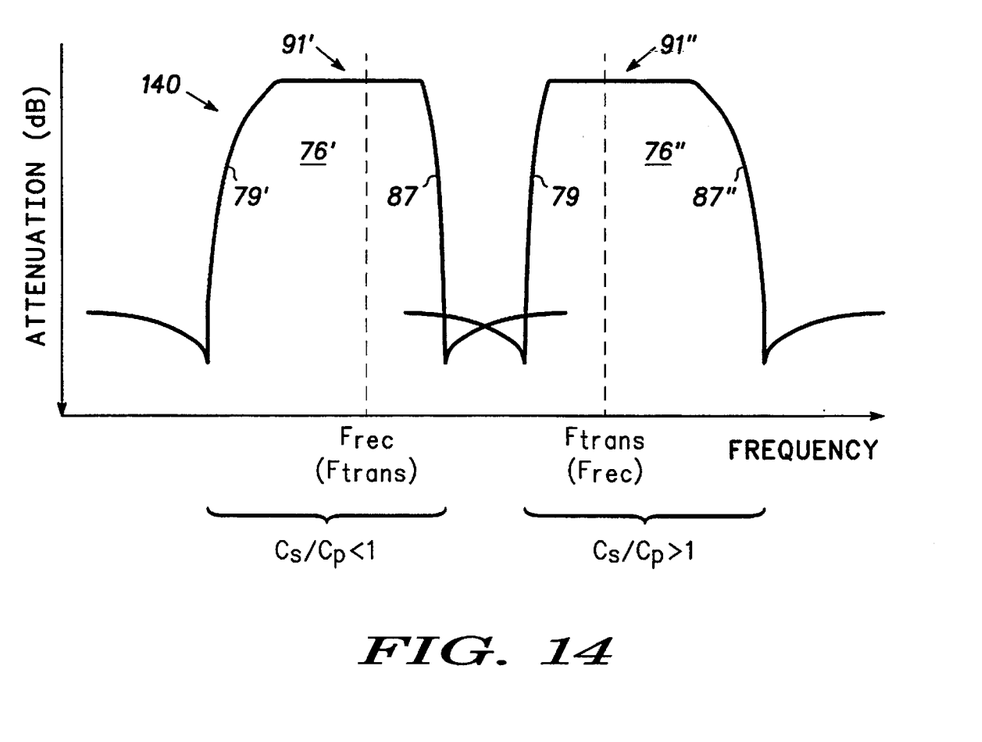
FIG. 14 is a plot of attenuation (ordinate, in dB) versus frequency (abscissa) for two SAW filters, one having a response of the type illustrated in FIG. 9, the other having a response of the type illustrated in FIG. 11, showing how they are arranged in frequency to simultaneously provide broader bandwidths and high isolation between closely spaced interfering signals.

FIG. 14 is a plot of transfer characteristic 140 (i.e., attenuation rs. frequency) for two SAW filters 92, 100 according to the present invention, one having response 76' of the type illustrated in FIG. 7 and the other having response 76" of the type. illustrated in FIG. 9. FIG. 14 shows how combined passbands 91', 91" are arranged in relative frequency for operation in radio 10. Passband 91' is arranged to be lower in frequency than passband 91", with, for example, passband 91' centered on receiver frequency $F_{rec}$ and passband 91" centered on transmitter frequency $F_{trans}$ of duplex radio 10 (note that the relative frequency of the transmitter and receiver can be interchanged). This places comparatively steep skirt portions 87, 79 closest together in frequency and more gradual skirt portions 79', 87" furthest apart in frequency.

Assuming that $F_{rec}<F_{trans}$, then filters 16' and 18 of radio 10 of FIG. 1 are desirably of type 92 illustrated in FIGS. 8, 9 and filters 16", 42 are desirably of type 100 illustrated in FIGS. 10, 11. Conversely, assuming that $F_{trans}<F_{rec}$, then filters 16', 18 of radio 10 of FIG. 1 are desirably of type 100 illustrated in FIGS. 10, 11 and filters 16", 42 are desirably of type 92 illustrated in FIGS. 8, 9. Transfer characteristic 140 illustrated in FIG. 14 is highly desirable for construction of duplex radios of improved performance.

Another manner of comprehending the present invention is to consider the relative coupling coefficients, where $C_1$ and $C_2$ represent the $K^2$ values of series resonators $50_1$ and parallel resonators $50_2$, respectively. Thus, in approximate terms: (i) for filter 70 with transfer characteristic 76, $C_1=C_2$ so that $C_1/C_2=1$; (ii) for filter 92 with transfer characteristic 76', $C_1<C_2$ so that $C_1/C_2<1$; and (iii) for filter 100 with transfer characteristic 76", $C_1>C_2$ so that $C_1/C_2>1$. Accordingly, transfer characteristics of the filters used in radio 10 and shown in FIG. 14 can be expressed as using for the lower of $F_{rec}$ or $F_{trans}$ a filter with $C_1/C_2<1$ and using for the higher of $F_{rec}$ or $F_{trans}$ a filter with $C_1/C_2>1$. It can be seen from FIGS. 1 and 14 that when $F_{rec}/F_{tran}<1$, receive SAW filters 16', 18 should have $C_1/C_2<1$ and transmit SAW filters 16", 42 should have $C_1/C_2>1$. Conversely, when $F_{trans}/F_{rec}<1$, then transmit SAW filters 16", 42 should have $C_1/C_2<1$ and receive SAW filters 16', 18 should have $C_1/C_2>1$.

By now it will be appreciated that there has been provided an improved means and method for radios embodying SAW filters of improved properties and improved SAW filters themselves. The improved devices provide in the same filter comparatively wider passband bandwidths while at the same time preserving the steepness of the low-high attenuation transition zone in the transfer characteristic on one side of the passband while allowing the transition zone on the opposite side of the passband to become less steep, where such decrease in steepness does not adversely affect radio performance. It will be further apparent based on the teachings herein that by using the above-described filters in pairs wherein the lower passband frequency filter has its steeper transition skirt on the higher frequency side of the passband, and the higher passband frequency filter has its steeper transition skirt on the lower frequency side, of its passband, that a radio of improved performance can be obtained. These filter pairs can be constructed on the same or different substrates.

We claim:

1. A filter utilizing surface acoustic wave (SAW) resonators, comprising, series coupled SAW resonators having first SAW coupling coefficients associated with one or more of said series coupled SAW resonators, and parallel coupled SAW resonators having second SAW coupling coefficients associated with one or more of said parallel coupled SAW resonators, wherein said series and parallel coupled SAW resonators are coupled to form said filter and said first and second SAW coupling coefficients are different.

2. A filter as claimed in claim 1 wherein said series and parallel coupled SAW resonators are formed on a common substrate.

3. A filter as claimed in claim 2 wherein said series and parallel coupled SAW resonators are formed on a common piezoelectric substrate.

4. A filter as claimed in claim 3 wherein said common piezoelectric substrate is chosen from a group consisting of forty-one degree y-rotated lithium niobate, sixty-four degree y-rotated lithium niobate and thirty-six degree y-rotated lithium tantalate.

5. A filter utilizing surface acoustic wave (SAW) resonators, comprising, series coupled SAW resonators having first SAW coupling coefficients associated with one or more of said series coupled SAW resonators, and parallel coupled SAW resonators having second SAW coupling coefficients associated with one or more of said parallel coupled SAW resonators, wherein said series and parallel coupled SAW resonators are coupled to form said filter and said first and second SAW coupling coefficients are different, wherein one or more of said series coupled SAW resonators or one or more of said parallel coupled SAW resonators, have a different metellization thickness from that of a remainder of said series or parallel coupled SAW resonators.

6. A radio incorporating surface acoustic wave (SAW) resonators on a common substrate, said radio comprising first series coupled SAW resonators and first parallel coupled SAW resonators, wherein one or more of said first series coupled SAW resonators have first SAW coupling coefficients, one or more of said first parallel coupled SAW resonators have second SAW coupling coefficients, and said first and second SAW coupling coefficients are different, wherein one or more of said first series coupled SAW resonators or one or more of said second parallel coupled SAW resonators comprise a first group of resonators having a first metallization thickness.

7. A radio as claimed in claim 6, further comprising second series coupled SAW resonators or second parallel coupled SAW resonators, wherein said second series or parallel coupled SAW resonators have second SAW coupling coefficients different than said first SAW coupling coefficients.

8. A radio as claimed in claim 6 wherein said first series coupled SAW resonators and said second parallel coupled SAW resonators are formed on a common piezoelectric substrate.

9. A radio as claimed in claim 8, wherein said common piezoelectric substrate comprises a material chosen from a group consisting of forty-one degree y-rotated lithium niobate, sixty-four degree y-rotated lithium niobate and thirty-six degree y-rotated lithium tantalate.

10. A radio as claimed in claim 6, wherein a second group comprising a remainder of said series and parallel coupled SAW resonators have a second metallization thickness different than said first metallization thickness.

11. A radio incorporating surface acoustic wave (SAW) resonators, said radio comprising a first filter with first series coupled SAW resonators with first SAW coupling coefficients and second parallel coupled SAW resonators with second SAW coupling coefficients, and a second filter with third series coupled SAW resonators with third SAW coupling coefficients and fourth parallel coupled SAW resonators with fourth SAW coupling coefficients, wherein a first ratio of said first SAW coupling coefficients divided by said second SAW coupling coefficients has a first value and a second ratio of said third SAW coupling coefficients divided by said fourth SAW coupling coefficients has a second value and said first and second values are different.

12. A radio as claimed in claim 11 wherein said first filter has asymmetric first and second skirts, said second skirt being steeper than said first skirt, and said second filter has asymmetric third and fourth skirts, said third skirt being steeper than said fourth skirt, wherein said second and third skirts are closer in frequency than said first and fourth skirts.

13. A radio comprising transmit and receive surface acoustic wave (SAW) filters, said radio operating with transmitter frequency $F_{trans}$ and receiver frequency $F_{rec}$, wherein when:

$F_{rec}/F_{trans}<1$, receive SAW filters have $C_1/C_2<1$ and transmit SAW filters have $C_1/C_2>1$; and $F_{trans}/F_{rec}<1$, said transmit SAW filters have $C_1/C_2<1$ and said receive SAW filters have $C_1/C_2>1$, wherein $C_1$ is a SAW coupling coefficient of series coupled resonators making up said transmit or receive SAW filters and $C_2$ is a SAW coupling coefficient of parallel coupled resonators making up said transmit or receive SAW filters.

14. A method for making SAW filters having asymmetric frequency characteristics, said method comprising steps of:

providing an substrate suitable for acoustic wave propagation;

disposing series coupled SAW resonators having first SAW coupling coefficients associated with one or more of said series coupled SAW resonators on said substrate; and disposing parallel coupled SAW resonators having second SAW coupling coefficients associated with one or more of said parallel coupled SAW resonators on said substrate, wherein said series and parallel coupled SAW resonators are coupled to form said filter and said first and second SAW coupling coefficients are different.

15. A method as claimed in claim 14 wherein said disposing steps include steps of disposing said series and parallel coupled SAW resonators on a common substrate.

16. A method as claimed in claim 15 wherein said disposing steps include steps of disposing said series and parallel coupled SAW resonators are formed on a common piezoelectric substrate.

17. A method as claimed in claim 16 wherein said step of providing a substrate includes a step of providing a common piezoelectric substrate chosen from a group consisting of forty-one degree y-rotated lithium niobate, sixty-four degree y-rotated lithium niobate and thirty-six degree yrotated lithium tantalate.

18. A method as claimed in claim 14 wherein said disposing steps include steps of disposing one or more of said series coupled SAW resonators or one or more of said parallel coupled SAW resonators having a different metallization thickness from that of a remainder of said series or parallel coupled SAW resonators.

19. A method as claimed in claim 17 wherein said disposing steps include steps of disposing one or more of said series coupled SAW resonators or one or more of said parallel coupled SAW resonators having a different metallization thickness from that of a remainder of said series or parallel coupled SAW resonators.

* * * * *